United States Patent [19]

Masunaga et al.

[11] Patent Number: 4,757,368
[45] Date of Patent: Jul. 12, 1988

[54] SEMICONDUCTOR DEVICE HAVING ELECTRIC CONTACTS WITH PRECISE RESISTANCE VALUES

[75] Inventors: Hikotaro Masunaga, Tokyo; Shinji Emori, Urawa, both of Japan

[73] Assignee: Fujitsu Limited, Kawasaki, Japan

[21] Appl. No.: 65,628

[22] Filed: Jun. 23, 1987

Related U.S. Application Data

[63] Continuation of Ser. No. 837,853, Mar. 6, 1986, abandoned, which is a continuation of Ser. No. 653,481, Sep. 21, 1984, abandoned, which is a continuation of Ser. No. 329,924, Dec. 11, 1981, abandoned.

[30] Foreign Application Priority Data

Dec. 15, 1980 [JP] Japan ................................ 55-176672

[51] Int. Cl.$^4$ ...................... H01L 27/02; H01L 23/48
[52] U.S. Cl. ........................................ 357/51; 357/65; 357/68
[58] Field of Search ................ 357/38, 51, 65, 68; 338/322

[56] References Cited

U.S. PATENT DOCUMENTS

| | | |
|---|---|---|
| 3,559,003 | 1/1971 | Beaudouin et al. ............ 357/51 |
| 3,629,782 | 12/1971 | Sahni . | |
| 3,922,707 | 11/1975 | Freed et al. ................ 357/51 |
| 4,022,931 | 5/1977 | Black ....................... 357/65 |
| 4,051,391 | 9/1977 | Ahmed ...................... 357/51 |
| 4,072,979 | 2/1978 | Palara ...................... 357/51 |
| 4,131,809 | 12/1978 | Baars ....................... 357/51 |
| 4,181,878 | 1/1980 | Murari et al. ............... 357/51 |
| 4,215,333 | 7/1980 | Huang ....................... 338/322 |
| 4,219,797 | 8/1980 | Huang ....................... 357/51 |
| 4,245,209 | 1/1981 | Bertotti et al. ............. 357/51 |
| 4,225,674 | 3/1981 | Grenies et al. .............. 357/51 |
| 4,314,269 | 2/1982 | Fujiki ...................... 357/51 |

FOREIGN PATENT DOCUMENTS 2018589 8/1975 Fed. Rep. of Germany .
1250988 10/1971 United Kingdom .............. 357/71

OTHER PUBLICATIONS

E. M. Hubacher et al, "Detecting Defects in Integrated Semiconductor Circuits" *IBM Technical Disclosure Bulletin*, vol. 14 (1972) pp. 2615–2617.

E. Berndlmaier, "Selectable Resistance Values for Integrated-Circuit Resistors", *IBM Technical Disclosure Bulletin*, vol. 19 (1977) pp. 4620–4621.

*IBM Technical Disclosure Bulletin*, "Reduced Electromigration Damage at Al Contacts to Si Integrated Circuits", by Joseph et al., vol. 15, No. 2, Aug. 1972, pp. 725–726.

*Primary Examiner*—J. Carroll
*Attorney, Agent, or Firm*—Staas & Halsey

[57] ABSTRACT

A semiconductor device includes a diffusion layer in the semiconductor substrate thereof; and an insulation layer is formed on the semiconductor substrate and is provided with a contact window therein, so as to electrically connect a conductive metal layer with the diffusion layer composed of Si atoms as a base material. A Si atom supplier is formed close to the contact window at the area where the Si atoms diffuse into the conductive metal layer. Preferably, the Si atom supplier comprises a dummy contact window similar to the above-mentioned real contact window.

18 Claims, 5 Drawing Sheets

Fig. 5
Fig. 3
PRIOR ART
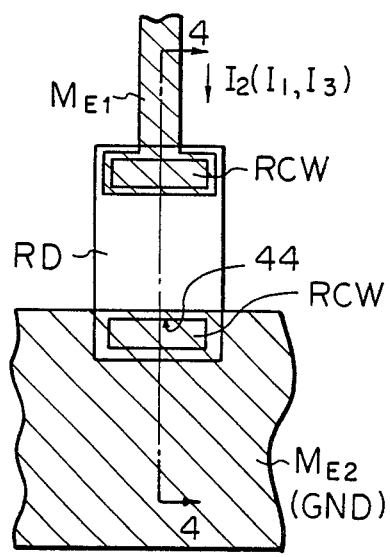
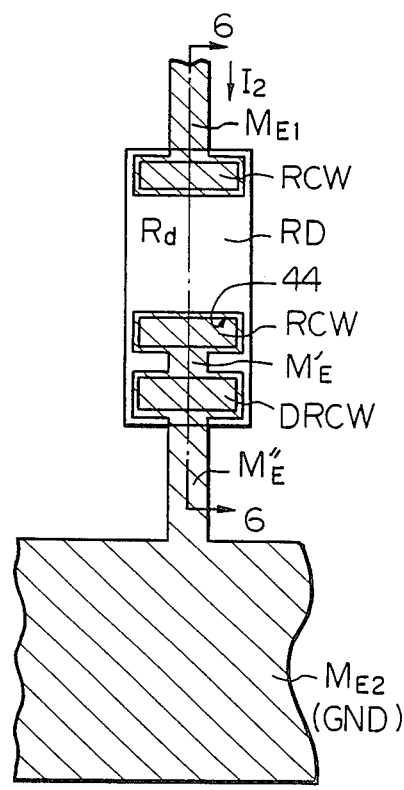

SEMICONDUCTOR DEVICE HAVING ELECTRIC CONTACTS WITH PRECISE RESISTANCE VALUES

This is a continuation of application Ser. No. 837,853 filed on Mar. 6, 1986, abandoned, which is a continuation of U.S. application Ser. No. 653,481 filed Sept. 21, 1984, abandoned; which is a continuation of U.S. application Ser. No. 329,924, filed Dec. 11, 1981, now abandoned.

BACKGROUND OF THE INVENTION

The present invention relates to a semiconductor device, more particularly, to an electric contact between a resistive diffusion layer formed in a semiconductor substrate and a conductive metal layer formed thereon.

In an integrated semiconductor circuit (IC), each resistor member is realized as a resistive diffusion layer formed in the semiconductor substrate, especially, as a diffusion layer having one conductivity type in a semiconductor substrate having the other conductivity type. The resistor member is then connected to the conductive metal layer formed on the semiconductor substrate, via the electric contact, so as to cooperate with another corresponding electric functional member or members. In such a case, the resistance value (R) is mainly determined by the resistance value ($R_d$) of the resistive diffusion layer and, secondarily, by the ohmic contact resistance value ($R_c$) created at the electrical contact. Thus, the actual resistance value (R) is usually defined as being a sum of the above-mentioned two resistance values ($R_d$) and ($R_c$). Accordingly, if the resistance value (R) must be strictly set to a predetermined value, not only the resistance value ($R_d$) but also the resistance value ($R_c$) must be strictly set so as to obtain the exact desired resistance value (R).

Generally, certain characteristics are known in the art regarding the resistance values ($R_d$) and ($R_c$). First, it is relatively easy to obtain a resistive diffusion layer which can maintain a correct resistance value ($R_d$) for a very long time. Second, it is considerably difficult to obtain an electric contact which can maintain a correct resistance value ($R_c$) for a very long time. The reason for this, briefly, is that, over a long period of time, undesired diffusion occurs in the area close to the electric contact when Si (silicon) atoms, which are in the diffusion layer, move into gaps between Al (aluminum) atoms which are in the conductive metal layer. Consequently, it is usually impossible to set exactly the resistance value (R) a correct value for a long time. For example, it is usually impossible to make resistor members for constructing a so-called current mirror circuit, because this type of circuit requires exactly correct resistance values, which must remain constant for a long period for time, of the respective resistor members.

SUMMARY OF THE INVENTION

Therefore, it is an object of the present invention to provide a semiconductor device having electric contacts, whereby each electric contact can maintain the exact correct resistance value for a long time.

BRIEF DESCRIPTION OF THE DRAWINGS

The present invention will be more apparent from the ensuing description with reference to the accompanying drawings wherein:

FIG. 3 is a partial plan view of FIG. 2, illustrating one of the resistors and its neighboring members;

FIG. 5 is a partial plan view of a first embodiment, according to the present invention, which is applied to the prior art device shown in FIG. 3;

DETAILED DESCRIPTION OF THE PREFERRED EMBODIMENTS

Figure 1:
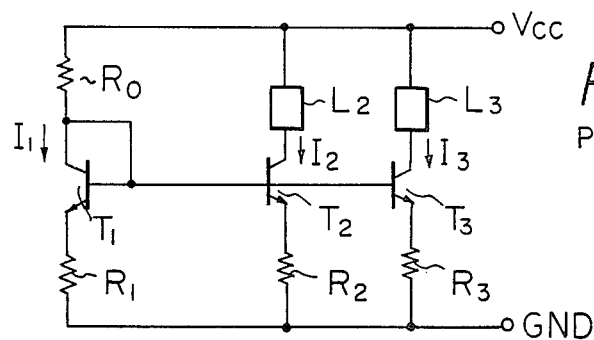
FIG. 1 is an example of a circuit diagram which must contain therein resistor members having exactly correct resistance values.

FIG. 1 is an example of a circuit diagram which must contain therein reistor members having exactly correct resistance values. The example of this figure represents the so-called current mirror circuit. The circuit is comprised of three transistors $T_1$, $T_2$, $T_3$, four resistor members $R_0$, $R_1$, $R_2$, $R_3$ and two loads $L_2$, $L_3$. The symbols $I_1$, $I_2$ and $I_3$ denote currents flowing in those respective paths. The current mirror circuit is inserted between the power supply voltage level $V_{cc}$ and ground level GND. If the transistors $T_1$, $T_2$ and $T_3$ are designed so as to all have the same base-emitter voltage $V_{BE}$ and so as to all have the same current transfer ratio $h_{FE}$, the values of the currents $I_1$, $I_2$ and $I_3$ are determined proportionally by the resistance values of the resistor members $R_1$, $R_2$ and $R_3$, respectively. Accordingly, if it is required to supply the currents $I_2$ and $I_3$ having a predetermined ratio between these current values, the resistance values of the resistor members $R_2$ and $R_3$ must also be determined by the same ratio as the above-mentioned ratio ($I_2/I_3=R_3/R_2$). Further, it is important to maintain the same ratio of the resistance values for a long time.

Figure 2:
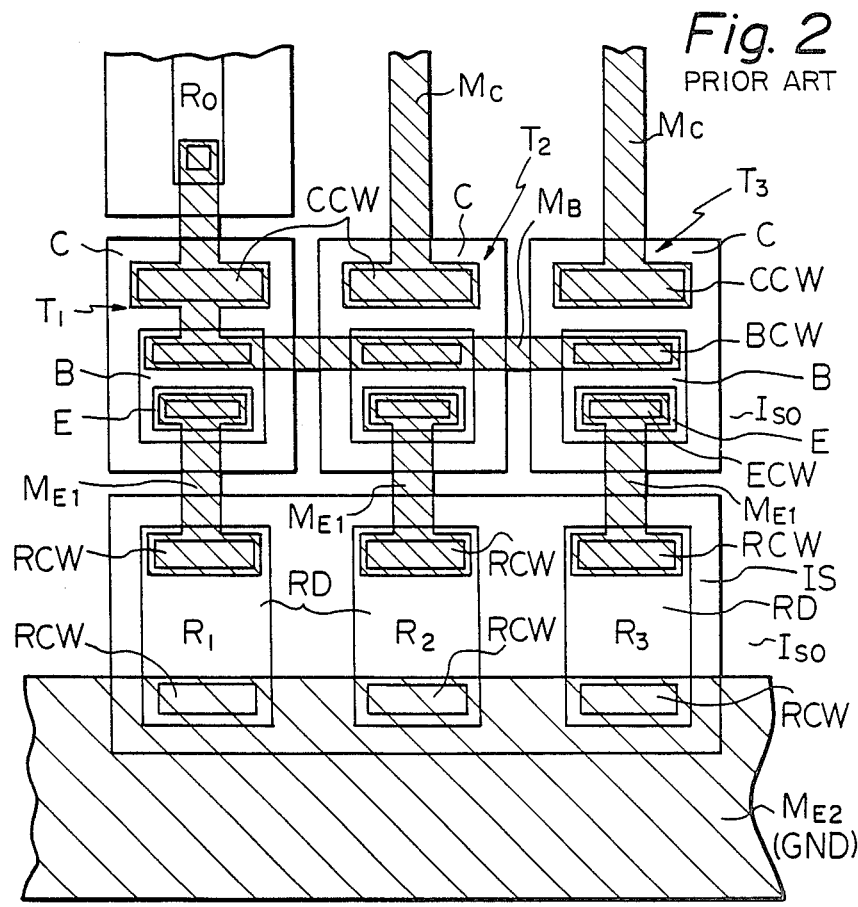
FIG. 2 is a plan view of a semiconductor circuit for fabricating the current mirror circuit of FIG. 1.

FIG. 2 is a plan view of a semiconductor circuit for fabricating the current mirror circuit of FIG. 1. In this case, it should be understood that, in this example, the above-mentioned ratio of the current values is set at 1, and, accordingly, the ratio of the resistance values is also set at 1. Therefore, the transistors $T_1$, $T_2$ and $T_3$ have the same physical conditions and also the resistor members $R_1$, $R_2$ and $R_3$ have the same physical conditions.

The transistors $T_1$, $T_2$ and $T_3$ are formed inside respective islands which are enclosed by an isolation area $I_{SO}$. The reference symbols C represent N-type collector regions. Each of the collector regions C is connected to a respective conductive metal layer MC via a respective collector contact window CCW. The reference symbols B represent P-type base regions. These three base regions B are commonly connected by a conductive metal layer $M_B$, via respective base contact windows BCW. The reference symbols E represent N-type emitter regions formed in the respective base regions B. Each of the emitter regions E is connected to a first conductive metal layer $M_{E1}$, via respective emitter contact windows ECW.

The resistor members $R_1$, $R_2$ and $R_3$ are formed inside an island which is also enclosed by the isolation area $I_{SO}$. This island is formed as an N-type region IS. The resistor members $R_1$, $R_2$ and $R_3$ are made of respective P-type resistive diffusion layers RD, located inside the island IS. Each of the resistive diffusion layers RD is connected, on the one hand, to the first conductive metal layer $M_{E1}$ via respective resistor contact windows RCW and, on the other hand, to a second conductive metal layer $M_{E2}$, via respective resistor contact windows RCW. The metal layer $M_{E2}$ comprises the ground level GND of FIG. 1.

In the current mirror circuit of FIG. 2, the resistor members $R_1$, $R_2$ and $R_3$ must be exactly identical to each other so as to supply the currents $I_1$, $I_2$ and $I_3$ with the exact same value. In this example, the previously mentioned ratio of currents is 1. Consequently, when designing a current mirror circuit, a designer usually designs the resistive diffusion layers RD to be physically identical with each other, and also designs the resistor contact windows RCW to be physically identical with each other. Examples of the physical conditions are the size of each layer RD and the size of each window RCW. In this case, it is very important to note that, as previously explained, the actual resistance value (R) is defined as being the sum of the resistance value, in series, of the resistor ($R_d$), which corresponds to the resistive diffusion layer RD, and the resistance value ($R_c$), which corresponds to the ohmic contact at the resistor contact window RCW. The resistance value ($R_d$) of the former is constant and does not vary once the diffusion layer RD is produced. In contrast, the resistance value ($R_c$) of the latter is not constant and varies over a long period of time. The resistance value ($R_c$) of the ohmic contact initially is a certain value when the manufacturing process has finished. However, thereafter, the resistance value ($R_c$) varies due to the aforementioned diffusion of the Si atoms into the gaps between the Al atoms in the Al layer. The Si atoms and the Al atoms respectively compose the layer RD and the layer $M_{E2}$ (also $M_{E1}$). To be more specific, over a long period of time, the Si atoms gradually penetrate into the gaps between the Al atoms. As will be apparent from this, even through the resistor members $R_1$, $R_2$ and $R_3$ have been manufactured to be of the exact same design, the resistance values thereof will be changed over a long period of time, due to the diffusion of the Si atoms into the Al layer. Usually, this above-mentioned problem is a very small matter, and, accordingly, no deleterious results take place in the currently existing resistor members; however, this problem is serious if the resistance values thereof must be fixed to exact values over a long period of time, as is neceessary in the current mirror circuit.

Figure 4:
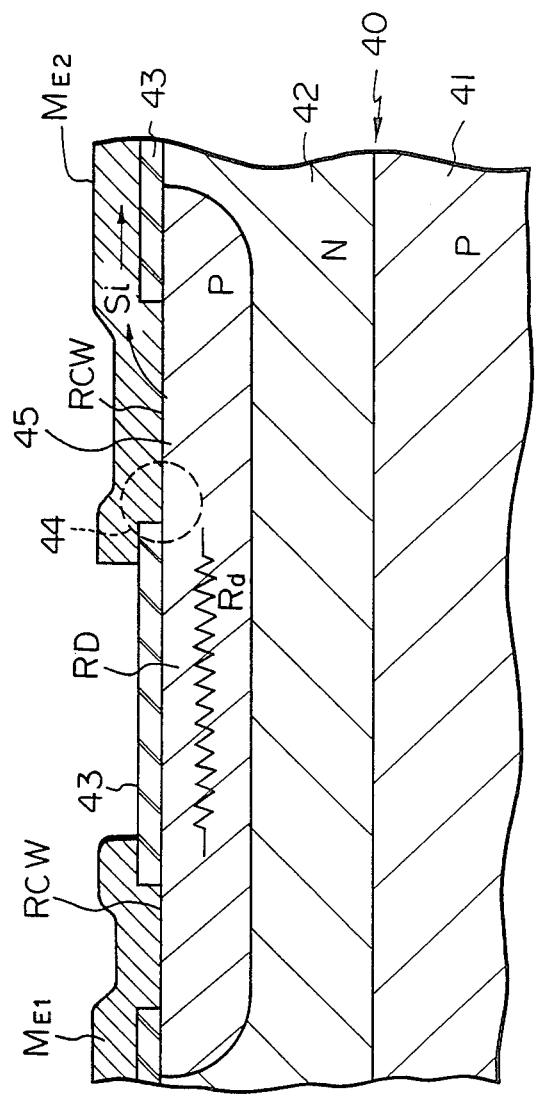
FIG. 4 is an enlarged cross-sectional view taken along the line 4—4 shown in FIG. 3.

FIG. 3 is a partial plan view of FIG. 2, indicating one of the resistors and its neighboring members. FIG. 4 illustrates an enlarged cross-sectional view taken along the line 4—4 shown in FIG. 3. The above-mentioned diffusion of Si atoms into the Al layer and the resultant variation of the resistance value will be clarified with reference to FIGS. 3 and 4. A semiconductor substrate 40 is comprised of a P-type semiconductor substrate 41 and an N-type semiconductor substrate 42 formed thereon. The P-type resistive diffusion layer RD is formed in the N-type substrate 42 and extended along the surface thereof. The resistive diffusion layer RD is connected to the conductive metal layers $M_{E1}$ and $M_{E2}$ via the respective resistor contact windows RCW. The resistor contact windows RCW are formed in an insulation layer 43.

The actual resistance value R of the resistor member shown in FIGS. 3 and 4 is the sum of the resistance value $R_d$ (shown in FIG. 4) and the resistance values ($R_c$) (not shown in FIG. 4) at the resistor contact windows RCW, that is the ohmic contact resistors. The present invention is specifically directed to such resistance values ($R_c$). This is because the resistance values ($R_c$) are liable to vary due to the aforesaid diffusion of the Si atoms. It should also be noted that such variation of the resistance value ($R_c$) at the window RCW (right side) is larger than that of the value ($R_c$) at the window RCW (left side). This is due to the fact that the Si atoms are liable to drift along the area that has a high gradient of Si density in the Al layer. In FIG. 4, the gradient of Si density in the Al layer $M_{E2}$ is higher than that of Si density in the Al layer $M_{E1}$, because the mass of the Al layer $M_{E2}$ is much larger than that of the Al layer $M_{E1}$, as clearly shown in FIG. 2 which ilustrates a large mass of the Al layer $M_{E2}$ acting as a ground bus. Thus, the resistance value at the window RCW for the layer $M_{E2}$ is liable to vary. Among all the areas, the area where the resistance value is most likely to vary, is at a peripheral portion 44, enclosed by a dotted circle in FIG. 4, of the window RCW. This is because the current flow becomes concentrated on the peripheral portion 44. The reason for this is simple. That is, the resistance value of the P-type resistive diffusion layer 45 under the window RCW (right side), is much larger than that of the conductive Al layer of this window RCW. Consequently, the variation of the resistance value is determined mainly by a variation induced by the above-mentioned Si diffusion which takes place at the peripheral portion 44.

FIG. 5 illustrates a partial plan view of a first embodiment, according to the present invention, which is applied to the prior art device shown in FIG. 3.

Figure 6:
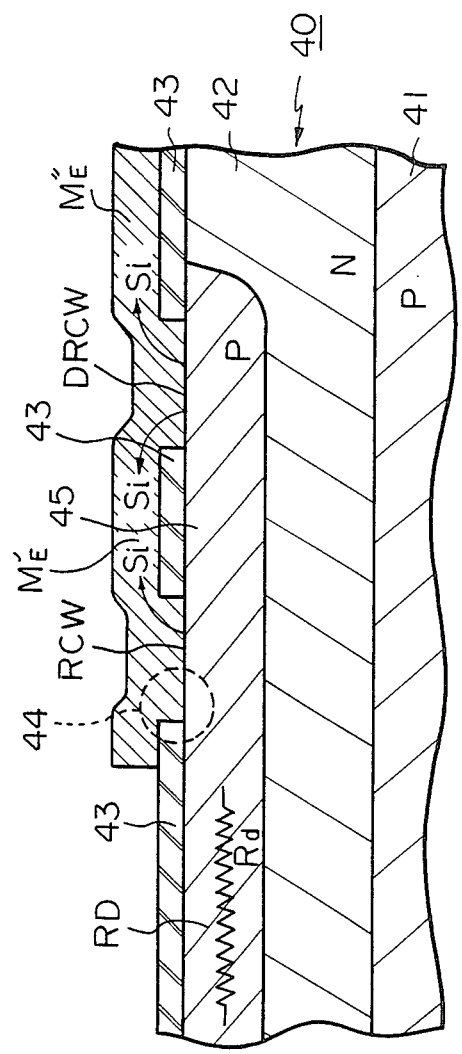
FIG. 6 is an enlarged cross-sectional view taken along the line 6—6 shown in FIG. 5.

FIG. 6 illustrates an enlarged cross-sectional view taken along the line 6—6 shown in FIG. 5. In FIGS. 5 and 6, the members represented by the same reference symbols and numerals are respectively identical to those of FIGS. 3 and 4. The most essential point of the present invention resides in the fact that a Si atom supplier is located close to the resistor contact window RCW. In FIGS. 5 and 6, the Si atom supplier is realized by a dummy resistor contact window DRCW. It is important that the dummy window DRCW be located in and along a path of a Si atom flow. The Si atom flow is created through the previously mentioned gradient of Si atom density in the Al layer. Therefore, the Si atoms flow from the windows RCW,DRCW toward the Al ground bus (GND). In FIGS. 5 and 6, the dummy window DRCW is positioned between the real window RCW and the Al layer $M_{E2}$ (GND).

As will be understood from FIG. 6, the Si atoms travel from the window RCW toward the Al layer $M_{E2}$ of FIG. 5, as schematically illustrated by an arrow. It is known that Si diffusion into an Al layer continues until the Al layer is saturated with Si. Saturation usually occurs at a density of 1%. Thus, the Si density around the window RCW is quickly accomplished. However, this saturation does not actually occur, because the Si atom flow does not stop as long as there is a large mass of the layer $M_{E2}$.

According to the present invention, however, the saturation of the Al layer with Si atoms can be expected to occur, due to the presence of the dummy window DRCW. It should be noted that similar Si atom flows also occur at the window DRCW, as schematically illustrated by two arrows in FIG. 6. The Si atom flow is directed, on the one hand, to the window RCW and, on the other hand, to the Al layer $M_{E2}$. In this case, the Si atom flow from the real window RCW is inhibited from advancing by the counter Si atom flow from the dummy window DRCW. Further, the Si atom flow toward the layer $M_{E2}$, is produced not from the real window RCW, but from the dummy window DRCW.

As a result, the Si atom diffusion into the Al layer from the real window no longer continues after the above mentioned saturation of Si atom is achieved in and around each of the windows RCW and DRCW. As described above, diffusion via window DRCW continues because the Si atom flow from the substrate to the Al layer does not stop as long as the mass of the layer $M_{E2}$ is large. Such areas of saturation may be obtained during the ordinary manufacturing process of the corresponding semiconductor devices by utilizing, for example, a heat treatment. Thus, Si diffusion in and around the window RCW, especially at the portion 44, can be prevented over a long period of time; thereby, the corresponding resistance value is maintained at a fixed value.

It is preferable to make the Al layer, contacting the windows RCW and DRCW, thin, as illustrated by conductive metal layers $M_E'$ and $M_E''$ in FIG. 5. The narrow Al layers $M_E'$ and $M_E''$ are more useful for slowing down the aforesaid Si atom flow toward the layer (GND), when compared with the wide Al layers of the prior art.

Figure 7:
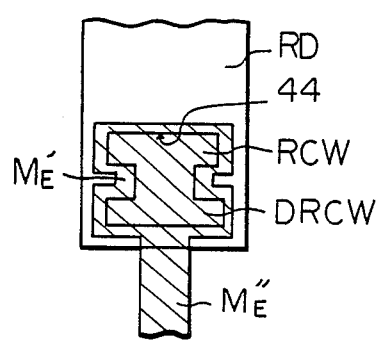
FIG. 7 is a partial plan view of a second emboidment according to the present invention.

FIG. 7 illustrates a partial plan view of a second embodiment according to the present invention. In the second embodiment, the resistor contact window RCW and the dummy resistor contact window DRCW are formed as one continuous body, but are slightly separated from each other by means of the narrow conductive metal layer $M_E'$. In this case of FIG. 7, the insulation layer 43 (referring back to FIG. 6), located between the windows RCW and DRCW, is not necessary. As will be understood from the first and second embodiments, the configuration of the dummy resistor contact window can freely be selected at will. At any rate, the configuration of the window is not so important in the present invention as long as the Si diffusion into the Al layer, especially at the peripheral portion 44, is stopped.

Figure 8:
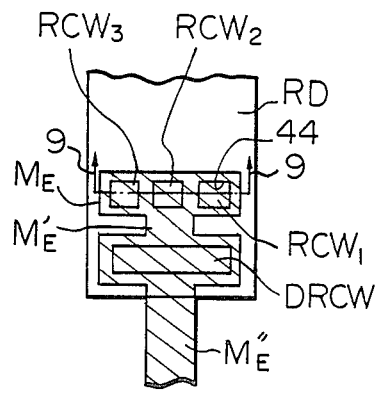
FIG. 8 is a partial plan view of a third embodiment according to the present invention, which is applied to the prior art device shown in FIG. 3.
Figure 9:
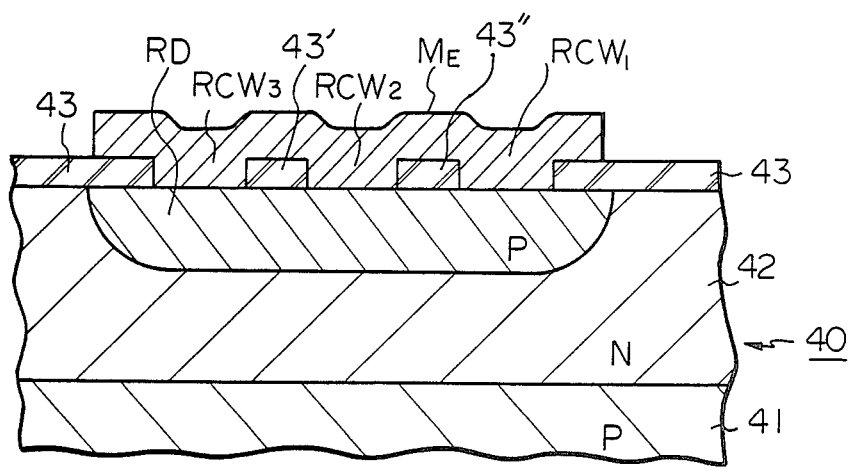
FIG. 9 is an enlarged cross-sectional view taken along the line 9—9 shown in FIG. 8.

FIG. 8 illustrates a partial plan view of a third embodiment, according to the present invention, which is applied to the prior art device shown in FIG. 3. And, FIG. 9 illustrates an enlarged cross-sectional view taken along the line 9—9 shown in FIG. 8. In FIGS. 8 and 9, the members represented by the same reference symbols and numerals are respectively identical to those of FIGS. 5, 6 and 7. As seen from FIGS. 8 and 9, the resistor contact window RCW is divided, for example, into three resistor contact windows $RCW_1$, $RCW_2$ and $RCW_3$, and these are arranged along the peripheral portion 44. It is known that the undesired diffusion of Si atoms into the conductive metal (Al) layer ($M_E$) starts growing, not uniformly along the peripheral portion 44, but from a few specific points along this portion 44. Then the diffusions grow, from the above-mentioned respective starting points, radially, as in a chain reaction. It is also important to slow down such radial growth of the Si atom diffusions. In order to slow down such radial growth, in the third embodiment, the resistor contact window RCW is divided into three windows $RCW_1$, $RCW_2$ and $RCW_3$, adapted to form barriers therebetween. The barriers are referenced by 43' and 43'' in FIG. 9, which barriers are effective for standing in the way of the Si atoms and stopping the diffusion from spreading farther. In this embodiment, it is not preferable to form identical barriers in the dummy resistor contact window DRCW. As understood from the aforementioned explanations with reference to FIGS. 5, 6 and 7, the Si diffusions should be performed sufficiently in the dummy window DRCW, to counter the Si atom flow from the real contact window RCW.

As mentioned above in detail, the present invention is able to produce semiconductor devices provided with resistors having accurate, constant and stable resistance values over a long period of time.

We claim:

1. A semiconductor device comprising:
a semiconductor substrate of a first conductivity type;
a resistor diffusion layer of a second conductivity type, formed in said semiconductor substrate, said resistor diffusion layer including Si atoms and having two terminal portions between which a current flows;
an insulation layer formed on the surface of said semiconductor substrate, said insulation layer having therein a real contact window for partially exposing the surface of one of the two terminal portions of said resistor diffusion layer and for substantially determining a resistance value between the two terminal portions of said resistor diffusion layer;
a Si atom supplier formed adjacent said real contact window; and
an aluminum conductive layer formed on said insulation layer, in the real contact window and in said Si atom supplier, said real contact window having a region in which Si atoms diffuse into said aluminum conductive layer, said Si atom supplier being formed adjacent said region where the flow of Si atoms diffuses into said aluminum conductive layer, said aluminum conductive layer having a first width portion on said real contact window and having a second width portion connecting said real contact window and said Si atom supplier, said second width portion being narrower than said first width portion, said aluminum conductive layer further having a wide portion and an extending portion for connecting said resistor diffusion layer to said wide portion, said aluminum conductive layer being formed so that said real contact window, said second width portion, and said Si atom supplier are arranged sequentially on a line from said resistor diffusion layer to said extending portion, said second width portion of said aluminum of said aluminum conductive layer for slowing down said Si atom flow.

2. A semiconductor device as set forth in claim 1, wherein said wide portion of said aluminum conductive layer comprises a reference portion formed on said insulation layer, and wherein said extending portion comprises a narrow portion of substantially the same width as said second width portion for connecting said Si atom supplier to said reference portion.

3. A semiconductor device as set forth in claim 1, wherein said Si atom supplier comprises a dummy contact window similar to said real contact window, and a connecting window for connecting said dummy contact window to said real contact window, so that said real contact window, said connecting window and said dummy contact window form one continuous body.

4. A semiconductor device as set forth in claim 1, wherein said Si atom supplier comprises a dummy contact window similar to said real contact window.

5. A semiconductor device as set forth in claim 1, wherein said Si atom supplier comprises a dummy contact window similar to said real contact window, wherein said real contact window is divided into a plurality of contact windows and wherein at least one barrier against the creation of said Si atom flow is positioned between two of said plurality of contact windows.

6. A semiconductor device as set forth in claim 5, wherein said at least one barrier is made of the same material as said insulation layer.

7. A semiconductor device comprising:
a semiconductor substrate of a first conductivity type;
a resistor diffusion layer of a second conductivity type, formed in said semiconductor substrate, said resistor diffusion layer including Si atoms and having two terminal portions between which a current flows;
an insulation layer formed on the surface of said semiconductor substrate, said insulation layer having therein a real contact window for partially exposing the surface of one of the two terminal portions of said resistor diffusion layer;
a Si atom supplier comprising a dummy contact window formed adjacent to said real contact window and separated therefrom; and
an aluminum conductive layer formed on said insulation layer, in the real contact window and in said dummy contact window, said real contact window having a region in which Si atoms diffuse into said aluminum conductive layer, said dummy contact window being formed adjacent said region where the flow of Si atoms diffuses into said aluminum conductive layer, said aluminum conductive layer having a first narrow portion connecting said dummy contact window and said real contact window, said aluminum conductive layer further having a wide portion and an extending portion for connecting said resistor diffusion layer to said wide portion, said aluminum conductive layer being formed so that said real contact window, said first narrow portion, and said dummy contact window are arranged sequentially on a line from said resistor diffusion layer to said extending portion, said first narrow portion of said aluminum conductive layer for slowing down said Si atom flow.

8. A semiconductor device as set forth in claim 7, wherein said wide portion of said aluminum conductive layer comprises a reference portion formed on said insulation layer, and wherein said extending portion comprises a second narrow portion for connecting said dummy contact window to said reference portion.

9. A semiconductor device comprising:
a semiconductor substrate of a first conductivity type;
a resistor diffusion layer of a second conductivity type, formed on said semiconductor substrate, said resistor diffusion layer including Si atoms and having two terminal portions between which a current flows;
an insulation layer formed on the surface of said semiconductor substrate, said insulation layer having therein a real contact window for partially exposing the surface of one of the two terminal portions of said resistor diffusion layer
a Si atom supplier comprising a dummy contact window formed adjacent said real contact window and separated therefrom; and
an aluminum conductive layer formed on said insulation layer, in said real contact window and in said dummy contact window, said real contact window having a region in which Si atoms diffuse into said aluminum conductive layer, said dummy contact window being formed adjacent said region where the flow of Si atoms diffuses into said aluminum conductive layer, said aluminum conductive layer having a first narrow portion connecting said real contact window and said dummy contact window, said aluminum conductive layer further having a wide portion and an extending portion for connecting said resistor diffusion layer to said wide portion, said aluminum conductive layer being formed so that said real contact window, said first narrow portion, and said dummy contact window are arranged sequentially on a line from said resistor diffusion layer to said extending portion, said first narrow portion of said aluminum conductive layer for slowing down said Si atom flow, said real contact window being divided into a plurality of contact windows and having at least one barrier against the creation of said Si atom flow formed between two of said plurality of contact windows.

10. A semiconductor device as set forth in claim 9, wherein said wide portion of said aluminum conductive layer further comprises a reference portion formed on said insulation layer, and wherein said extending portion comprises a second narrow portion for connecting said dummy contact window to said reference portion.

11. A semiconductor device as set forth in claim 10, wherein said at least one barrier is made of the same material as said insulation layer.

12. A semiconductor device as set forth in claim 9, wherein said at least one barrier is made of the same material as said insulation layer.

13. A semiconductor device comprising:
a semiconductor substrate of a first conductivity type;
a resistor diffusion layer of a second conductivity type opposite that of said first conductivity type, formed in said semiconductor substrate, said resistor diffusion layer having a surface, having two terminal portions between which a current flows, and including Si atoms;
an insulation layer formed on the surface of said semiconductor substrate, said insulation layer having a real contact window formed therein, said real contact window partially exposing the surface of one of the two terminal portions of said resistor diffusion layer;
means, formed adjacent said real contact window, for supplying Si atoms; and
an aluminum conductive layer formed on said insulation layer, in said real contact window, and in said means for supplying Si atoms, said means for supplying Si atoms supplying said Si atoms to the portion of said aluminum conductive layer overlying said real contact window, said aluminum conductive layer having a first narrow portion connecting said real contact window and said means for supplying Si atoms, said aluminum conductive layer further having a wide portion and an extending portion for connecting said resistor diffusion layer to said wide portion, said aluminum conductive layer being formed so that said real contact window, said first narrow portion, and said means for supplying Si atoms are arranged sequentially on a line from said resistor diffusion layer to said extending portion, said first narrow portion of said aluminum conductive layer for slowing down said Si atom flow.

14. A semiconductor device as set forth in claim 13, wherein said wide portion of said aluminum conductive layer further comprises a reference portion formed on said insulation layer, and wherein said extending portion comprises a second narrow portion for connecting said means for supplying Si atoms to said reference portion.

15. A semiconductor device as set forth in claim 14, wherein said means for supplying Si atoms comprises a dummy contact window.

16. A semiconductor device as set forth in claim 15, whrein said dummy contact window is positioned in and along the path of Si atom flow of said real contact window.

17. A semiconductor device as set forth in claim 13, wherein said means for supplying Si atoms comprises a dummy contact window.

18. A semiconductor device as set forth in claim 17, wherein said dummy contact window is positioned in and along the path of Si atom flow of said real contact window.

* * * * *